(12) United States Patent
Ruile et al.

(10) Patent No.: US 7,978,026 B2
(45) Date of Patent: Jul. 12, 2011

(54) TRANSVERSAL FILTER OPERATING USING SURFACE ACOUSTIC WAVES

(75) Inventors: Werner Ruile, Munich (DE); Clemens Ruppel, Munich (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/640,097

(22) Filed: Dec. 17, 2009

(65) Prior Publication Data

US 2010/0134211 A1 Jun. 3, 2010

Related U.S. Application Data

(63) Continuation of application No. PCT/EP2008/057504, filed on Jun. 13, 2008.

(30) Foreign Application Priority Data

Jun. 20, 2007 (DE) .......................... 10 2007 028 291

(51) Int. Cl.
*H03H 9/64* (2006.01)
*H03H 9/145* (2006.01)

(52) U.S. Cl. ..................................... 333/196; 310/313 C
(58) Field of Classification Search .................. 333/196; 310/313 C
See application file for complete search history.

(56) References Cited

U.S. PATENT DOCUMENTS

| | | | |
|---|---|---|---|
| 4,005,378 A | 1/1977 | Slobodnik, Jr. et al. | |
| 4,427,956 A * | 1/1984 | Murray et al. | 333/194 |
| 4,454,488 A * | 6/1984 | Hartmann | 333/195 |
| 4,543,547 A * | 9/1985 | Picquendar et al. | 333/193 |
| 4,604,595 A * | 8/1986 | Kadota | 333/196 |
| 4,684,907 A | 8/1987 | Zibis | |
| 4,785,270 A * | 11/1988 | Kinsman | 333/193 |
| 5,357,228 A | 10/1994 | Dufilie | |
| 5,808,524 A | 9/1998 | Watanabe | |
| 6,114,927 A * | 9/2000 | Matsuda et al. | 333/195 |
| 6,150,900 A | 11/2000 | Kadota et al. | |
| 6,504,453 B2 | 1/2003 | Fujii | |
| 6,525,629 B2 * | 2/2003 | Matsuda et al. | 333/195 |
| 6,577,209 B2 | 6/2003 | Kobayashi et al. | |
| 6,909,342 B2 | 6/2005 | Bergmann et al. | |

FOREIGN PATENT DOCUMENTS

| | | |
|---|---|---|
| DE | 691 00 625 T3 | 3/1994 |
| DE | 199 22 124 B4 | 12/1999 |

(Continued)

OTHER PUBLICATIONS

Morgan, D., P., et al., "Surface-Wave Devices for Signal Precessing", Studies in Electrical and Electonic Engineering 19, 1985, pp. 61-65, Elsevier. New York, NY.

Kadota, M., et al., "Small-Sized Low-Loss Reflector Filters Utilizing Reflection of Bleustein-Gulyaev-Shimizu and Shear Horizontal Waves at Free Edges of Substate", IEEE Ultrasonics Symposium, 1999, pp. 55-59.

(Continued)

*Primary Examiner* — Barbara Summons
(74) *Attorney, Agent, or Firm* — Slater & Matsil, L.L.P.

(57) ABSTRACT

A transversal filter operates using surface acoustic waves and has a piezoelectric substrate and an acoustic track that is arranged on the substrate and in which a first transducer and a second transducer are arranged. Each transducer has electrode fingers. A function, which characterizes the weighting of the overlap length of electrode fingers of different polarity in the second transducer, has a half main lobe and at least one side lobe. The amplitude of the lobes decreases monotonally in a direction that points to the first transducer.

20 Claims, 4 Drawing Sheets

FOREIGN PATENT DOCUMENTS

| | | |
|---|---|---|
| DE | 100 26 074 A1 | 11/2001 |
| EP | 0 204 168 A2 | 12/1986 |
| EP | 1 137 175 A2 | 9/2001 |
| EP | 1 207 621 A2 | 5/2002 |
| GB | 2 287 580 A | 9/1995 |
| JP | 3-68206 * | 3/1991 |
| JP | 2000-040940 A | 2/2000 |

OTHER PUBLICATIONS

Kadota, M., "BGS Wave and SH Wave Resonator Filters Using Edge Reflections", IEEE Ultrasonics Symposium, 2000, 8 pages.

Kadota, M, et al., "High Frequency Resonators with Excellent Teperature Characteristics Using Edge Reflection", IEEE Ultrasonics Symposium, 2006, 5 pages.

* cited by examiner

TRANSVERSAL FILTER OPERATING USING SURFACE ACOUSTIC WAVES

This application is a continuation of co-pending International Application No. PCT/EP2008/057504, filed Jun. 13, 2008, which designated the United States and was not published in English, and which claims priority to German Application No. 10 2007 028 291.7 filed Jun. 20, 2007, both of which applications are incorporated herein by reference.

BACKGROUND

By way of example, a transversal filter is described in the U.S. Pat. No. 5,808,524.

SUMMARY

In one aspect, the invention specifies a transversal filter with a reduced chip area.

A transversal filter operates using surface acoustic waves. The transversal filter is implemented in an SAW chip having a piezoelectric substrate and an acoustic track that is arranged on the substrate and in which a first transducer and a second transducer are arranged. SAW is short for surface acoustic wave. Each transducer has electrode fingers. A function which characterizes the weighting of the overlap length of electrode fingers of different polarity in the second transducer has a cut-off main lobe and at least one side lobe. The amplitude of the lobes decreases monotonically in a direction which points to the first transducer. The cut-off main lobe preferably represents half a symmetrical main lobe.

By way of example, the second transducer may be obtained by halving a weighted transducer whose impulse response is symmetrical. When the wave is reflected without losses, for example, on a chip edge, this results in a symmetrical impulse response for the half transducer as well.

It has therefore been identified that, as a result of the reflection of the wave on the reflector, the length of a weighted transducer is halved, thus making it possible to achieve a significant reduction in the chip area. Furthermore, the insertion loss in the pass band of the filter can be reduced by about 3 dB.

A wave type which can be reflected essentially without losses on a chip edge is used in the transversal filter. By way of example, this is the case with a shear wave.

According to a further aspect, a transversal filter is specified which operates with surface acoustic waves having a piezoelectric substrate and an acoustic track which is arranged on the substrate and in which a first transducer and a second transducer are arranged. The second transducer is split into at least two sub-transducers in the transverse direction. At least one of the sub-transducers is offset laterally (that is to say in the longitudinal direction) with respect to at least one other sub-transducer. The longitudinal direction is a direction in which the wave excited in the acoustic track propagates. The transverse direction is a direction at right angles to this.

Filters having a symmetrical impulse response can be produced by means of a symmetrical weighted transducer or by means of a halved weighted transducer. However, many applications require asymmetric impulse responses in order, for example, to make it possible to achieve group delay time distortion or asymmetric amplitude profiles. This can also be achieved in components which use chip edge reflections.

For this purpose, the weighted transducer is split transversally into at least one in-phase sub-transducer and at least one quadrature sub-transducer. An in-phase sub-transducer is a sub-transducer in which the wave which is excited in this transducer and is reflected on the reflector has a phase shift of $2\pi m$. A quadrature sub-transducer is a sub-transducer in which the wave which is excited in this transducer and is reflected on the reflector has a phase shift of $(2n+1)\pi$. The two sub-transducers are shifted through a quarter of the wavelength with respect to one another, to be precise through $\lambda/4+n\lambda$. $n=0, 1, 2, \ldots$.

The chip edge which is provided as a reflector can in all embodiments be replaced by a trench of adequate depth, which extends in the transverse direction. The depth of the trench is preferably at least half the wavelength.

The first transducer is preferably arranged between the second transducer and a matched load formed by a wedge of glossy material, that is to say an acoustically damping area. The matched load formed by a wedge of glossy material can in all embodiments be replaced or complimented by an oblique chip edge or by some other suitable measure.

The second transducer is preferably provided as an input transducer and the first transducer as an output transducer, or vice versa. A portion of the acoustic wave produced in the input transducer runs in the direction of the output transducer and produces an impulse response in it which corresponds to the predetermined transfer function of the filter. The impulse response is a time signal, that is to say a pulse sequence.

The impulse response is governed by the profile of the wave produced in the input transducer (that is to say the second transducer). The profile of the wave can be adjusted by suitable weighting of an overlap function in the input transducer. The overlap function indicates the overlap length between adjacent electrode fingers of different polarity as a function of the longitudinal co-ordinate. The maximum overlap length in the respective transducer is referred to as the aperture of this transducer.

In the case of a halved second transducer, a portion of the impulse response is governed by a physically present overlap function in the second transducer, and the other portion of the impulse response is governed by an overlap function which is virtually present as a result of the "mirroring on the reflector". This applies on the one hand for the real component and on the other hand for the imaginary component of the impulse response.

The reflector therefore serves for symmetrical or anti-symmetrical virtual continuation of the overlap weighting function. The distance between the second transducer and the reflector, that is to say the path difference between the excited wave and the reflected wave, now determines whether a symmetrical or anti-symmetrical impulse response is achieved.

The transversal filter preferably has no resonant area in which a standing wave could form.

The respective transducer preferably has electrode fingers of different polarity arranged in an alternating sequence. The width of each electrode finger in the first transducer is essentially one quarter of the wavelength. Each electrode finger in the second transducer is in the form of a split finger.

The second transducer is preferably adjacent to an acoustic reflector on the side facing away from the first transducer. The reflector and the second transducer are aligned with respect to one another such that an acoustic wave which passes through the second transducer in the direction of the reflector at a pass frequency of the filter is essentially totally internally reflected on the reflector.

In order to produce a symmetrical impulse response, provision is made in one embodiment for the reflected acoustic wave not to be phase-shifted or to be phase-shifted through an integer multiple of $2\pi$, by means of a suitably chosen path-length difference in comparison to the wave excited in the second transducer. The minimum distance between the reflector and a finger facing it at the end of the second transducer is in this case $d/2+n\lambda/2$, where d is the minimum distance between two sub-fingers of the respective split finger of the second transducer, n is an integer and $\lambda$ is a wavelength of a frequency in the pass band of the transversal filter. By way of example, d is $\lambda/8$ if the metallization ratio, that is to say the proportion of the metalized surface area, in the second transducer is 0.5.

The distance between mutually facing edges of two fingers is referred to as the minimum distance between these fingers. This also applies in a corresponding manner to the end finger of the second transducer and to the chip edge.

The second transducer can be produced by cutting through a transducer having a symmetrical weighting function in the center, for example, between two sub-fingers of a split finger. The finger at the end of the second transducer facing the reflector in this embodiment represents a sub-finger of a split finger, with the other sub-finger of this split finger being only virtually present.

Alternatively, the transducer with a symmetrical weighting function can be cut through between two split fingers. The finger at the end of the second transducer facing the reflector in this embodiment represents a sub-finger of a split finger which is actually present.

In one embodiment, an anti-symmetrical impulse response is produced by the reflected acoustic wave being phase-shifted through $\pi$ or $(2n-1)\pi$, by means of a suitably chosen path-length difference in comparison to the wave excited in the second transducer. The distance between the reflector and a finger facing it at the end of the second transducer is in this case approximately $d/2+(2n-1)\lambda/4$.

By way of example, the reflector may be formed by an edge of the substrate or by a groove which is formed in the substrate and has relatively steep side walls. The edge of the substrate or the groove preferably extends essentially parallel to the electrode fingers of the second transducer.

By way of example, the groove on the surface of the substrate may be produced by a dry etching process. If the reflection on a sufficiently deep trench with steep edges on the surface of the chip is used instead of a reflection on a chip edge, then a non-rectangular chip can also be used as the substrate. The definition of the reflection location by etching has the advantage that the position is determined by the accuracy of a lithography process. In this case, the requirements for a matched load formed by a wedge of glossy material are considerably less stringent since only waves regenerated by the multiple reflections on the load of the input transducer are output again through the output transducer.

In one embodiment, weighting of the electrode fingers in the second transducer essentially follows a positive element of the function $\sin(x)/x$.

In one advantageous embodiment, the second transducer is split in the transverse direction into at least two sub-transducers. At least one of the sub-transducers is offset with respect to at least one other sub-transducer in the longitudinal direction. The offset in the longitudinal direction between the sub-transducers is preferably essentially one quarter of the wavelength.

In one embodiment, the second transducer in the transverse direction is split into a first sub-transducer and two second sub-transducers, wherein the first sub-transducer is arranged between the second sub-transducers. The first sub-transducer is aligned with respect to the reflector such that total internal reflection without any sudden phase change essentially takes place on the reflector. The respective second sub-transducer is aligned with respect to the reflector as if total internal reflection with a sudden phase change of essentially $(2n-1)\pi$ were to take place on the reflector.

In one embodiment, a third transducer is provided, which is aligned obliquely with respect to the first acoustic track. The third transducer is preferably also adjacent to the reflector, to be precise to that edge of the substrate which is provided as a reflector.

A wave which is excited in the third transducer is deflected on the edge of the substrate such that it arrives in the first transducer.

In one embodiment, the third transducer is aligned such that the wave which is transmitted by it and is deflected by the reflector at least partially cancels out a signal which is produced in the second transducer and follows outside the predetermined time window.

In order to compensate for diffraction effects, it is possible to modify the wave profile of the wave to be produced in the second transducer, with the second transducer representing an input transducer. For this purpose, the second transducer can be split into a plurality of preferably identical sub-transducers, which are conductively connected to one another. Two sub-transducers can in each case be arranged alongside one another in the longitudinal direction. Two sub-transducers can also in each case be arranged alongside one another in the transverse direction. They can also be electrically connected in series. Alternatively, they can be connected electrically in parallel. In this context, reference is made to the document DE 199 22 124 B4, also published as U.S. Pat. No. 6,150,900.

All transducers in the transversal filter are preferably free of internal reflections, that is to say the reflections of the acoustic waves on the fingers of the transducer. Freedom from reflection can be achieved, in particular, in the case of a normal finger transducer by, for example, an electrically isolating layer which is arranged over the electrodes of this transducer. A $SiO_2$ layer is particularly suitable for this purpose. The use of split fingers in the respective transducer also leads to freedom from reflections.

BRIEF DESCRIPTION OF THE DRAWINGS

The specified filter and its advantageous refinements will be explained in the following text with reference to schematic figures, which are not to scale, in which.

Figure 1:
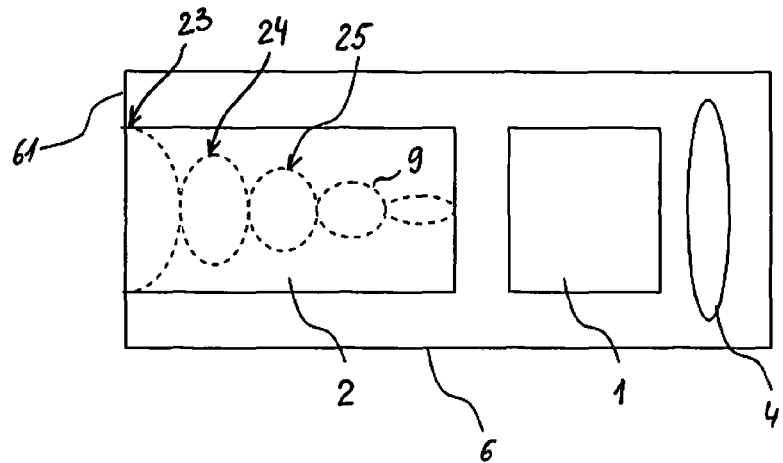
FIG. 1 shows a transversal filter with a symmetrical impulse response.

The following list of reference symbols may be used in conjunction with the drawings:
1 First transducer
11, 12 Electrode fingers of the first transducer
2 Second transducer
21 First sub-transducer of the second transducer
22 Second sub-transducer of the second transducer
23 Main lobe 24, 25 Side lobes
3 Third transducer
4 Acoustically damping area
6 Piezoelectric substrate
61 Acoustic reflector
7 Distance
81, 82 Sub-fingers of a split finger in the second transducer
83 Electrode finger at the end of the second transducer
9 Weighting function
d Distance between the sub-fingers 81, 82 of the respective split finger

DETAILED DESCRIPTION OF ILLUSTRATIVE EMBODIMENTS

One example of a transversal filter is explained in FIG. 1. The filter has a piezoelectric substrate 6. An acoustic track is arranged on the substrate 6.

A first transducer 1 and a second transducer 2 are arranged in the track. The track is bounded on the side of the first transducer by an area 4 which is in the form of a matched load formed by a wedge of glossy material. The first transducer 1 is arranged between the second transducer 2 and the area 4 which is in the form of a matched load formed by a wedge of glossy material.

The acoustic track is bounded on the side of the second transducer 2 by an acoustic reflector 61. In the embodiment shown in FIG. 1, the reflector 61 is formed by an edge of the substrate 6, and in the embodiment shown in FIG. 5, it is in the form of a groove formed in the substrate 6.

Figure 5:
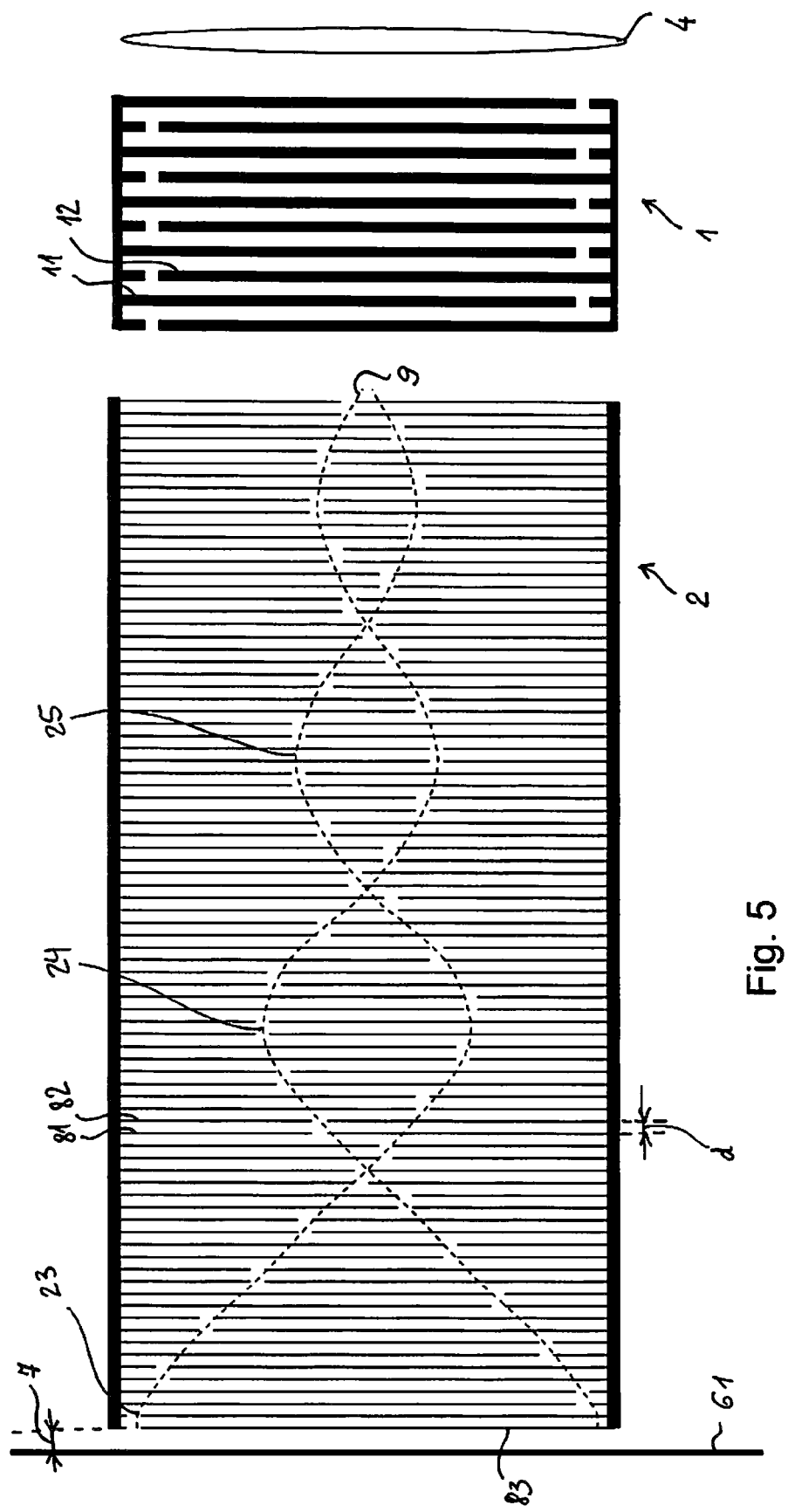
FIG. 5 shows a transversal filter with a groove provided as a reflector.

The first transducer 1 has first and second electrode fingers 11, 12 which engage in one another, see FIG. 5. The first transducer 1 is preferably in the form of a normal finger transducer. This means that the distance measured from one finger center to another between the electrode fingers of different polarity at a pass frequency of the filter is half the wavelength, and the finger width is essentially one quarter of the wavelength.

In the embodiment shown in FIG. 5, the second transducer 2 has split fingers. In this case, each split finger in each case has two adjacent sub-fingers 81, 82 of the same polarity, or the sub-fingers 81, 82 of the same polarity together form one split finger.

The overlap function in the second transducer 2 is weighted. The overlap weighting function 9 has one half main lobe 23 and a plurality of side lobes 24, 25, with the cut-off side of the half main lobe 23 pointing toward the reflector 61 or to the substrate edge 61.

A portion of the acoustic wave which is excited in the second transducer 2 runs in the direction of the first transducer 1. The other portion of the wave runs in the opposite direction, that is to say in the direction of the reflector 61, and is reflected on this reflector.

The distance d between the sub-fingers 81, 82 of the respective split finger is measured between mutually facing edges of these sub-fingers. The distance 7 between the end electrode finger 83 of the second transducer 2 and the reflector 61 is d/2, in one embodiment. The wave reflected on the reflector 61 has a phase shift of 0° with respect to the originally excited wave. This results in a symmetrical impulse response. This embodiment is illustrated schematically in FIG. 1.

Figure 2:
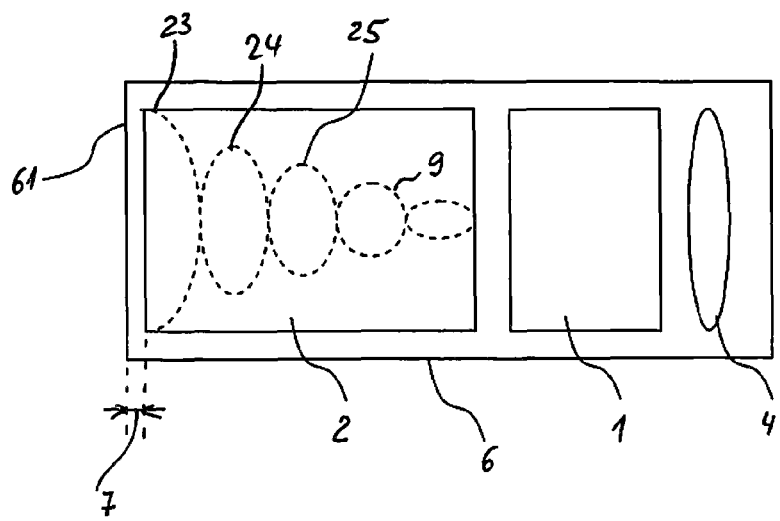
FIG. 2 shows a transversal filter with an anti-symmetrical impulse response.

The distance 7 between the end electrode finger 83 of the second transducer 2 and the reflector 61 is $d/2+\lambda/4$, in a further embodiment. The wave reflected on the reflector 61 has a phase shift of 180° with respect to the originally excited wave. This results in an anti-symmetrical impulse response. This embodiment is illustrated schematically in FIG. 2.

Figure 3:
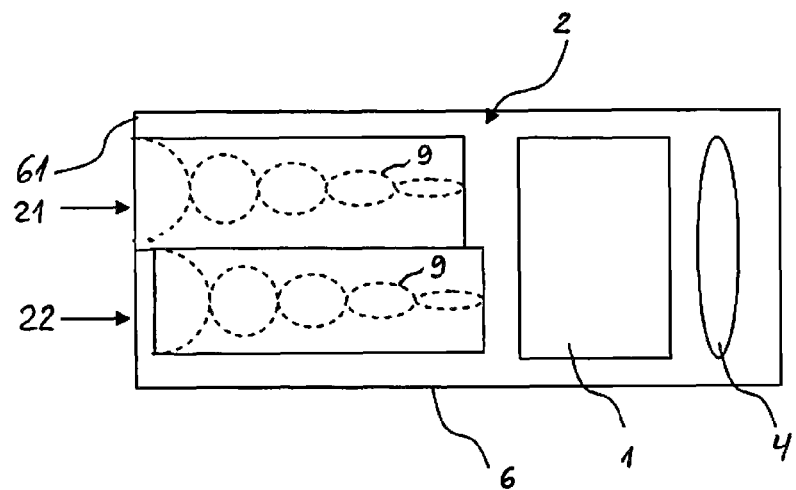
FIG. 3 shows a transversal filter with a weighted transducer, which has two sub-transducers offset in the longitudinal direction.

FIG. 3 shows an embodiment of the transversal filter in which the second transducer 2 is split into two sub-transducers 21, 22 in the transverse direction. The first sub-transducer 21 is implemented, that is to say weighted, essentially in the same way as the second transducer 2 explained in FIG. 1, and is designed to produce a symmetrical impulse response. The second sub-transducer 22 is produced, that is to say weighted, essentially in the same way as the second transducer 2 explained in FIG. 2, and is designed to produce an anti-symmetrical impulse response. The second sub-transducer 22 is shifted through one quarter of the wavelength in the longitudinal direction, in comparison to the first sub-transducer 21.

The second split transducer 2 has a component in the upper track which produces a symmetrical impulse response, and has a component in the lower track which produces an anti-symmetrical impulse response because of a shift through $\lambda/4$ with respect to the chip edge. During the design of the filter, it is therefore possible to set the magnitude and phase of the transfer function of the filter independently of one another. In order to minimize weighting losses resulting from the use of two acoustic tracks, the aperture component of the upper track is enlarged until the predetermined phase of the transfer function is achieved.

Figure 6:
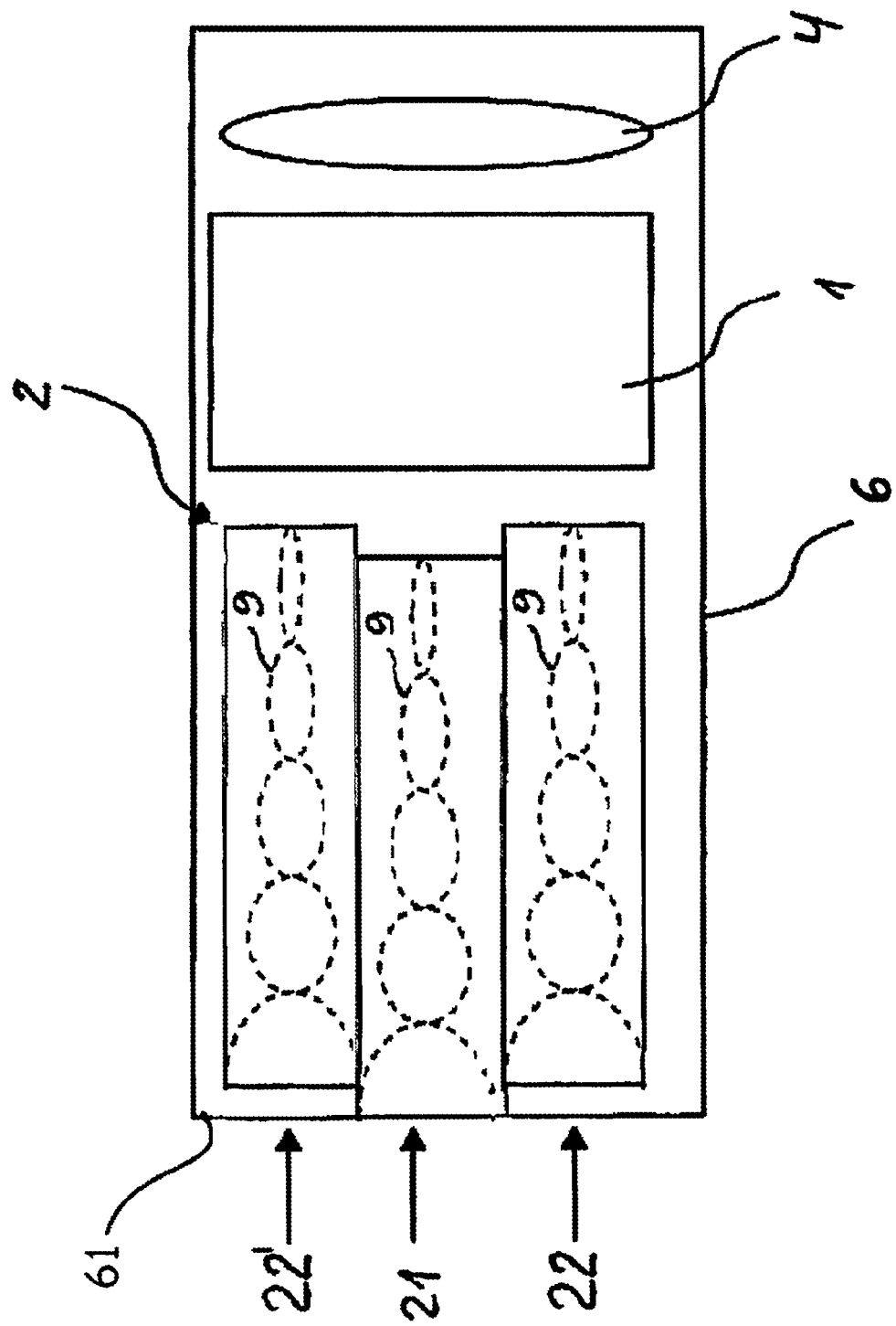
FIG. 6 shows a transversal filter wherein the second transducer is split into a first sub-transducer and two second sub-transducers.

In one embodiment, the second transducer 2 can be split into three sub-transducers. A sub-transducer which is suitable for production of the symmetrical impulse response is preferably provided in the central track, and a sub-transducer for production of the anti-symmetrical impulse response is preferably provided in each of the two edge tracks. For example, FIG. 6 illustrates an embodiment where the second transducer in the transverse direction is split into a first sub-transducer 21 and two second sub-transducers 22 and 22'. The first sub-transducer 21 is arranged between the second sub-transducers 22 and 22'.

Figure 4:
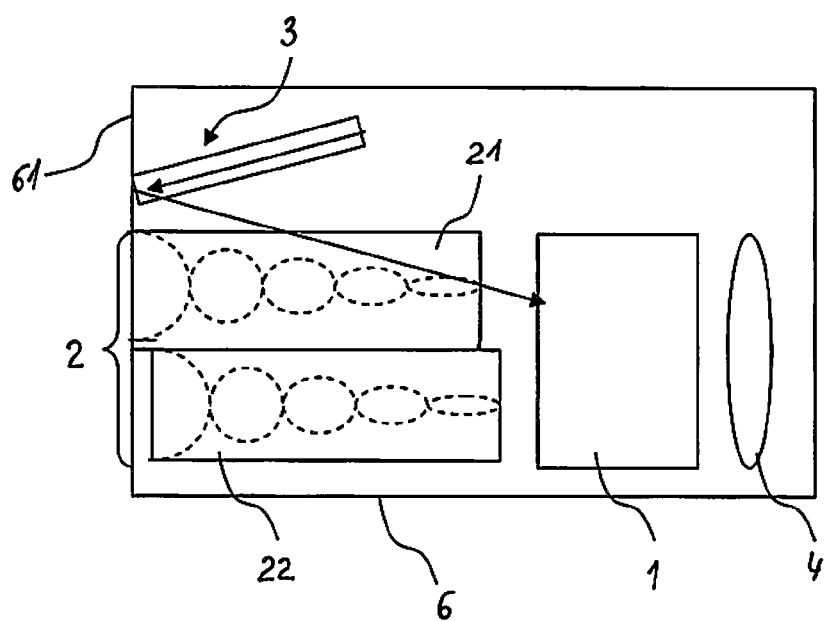
FIG. 4 shows the transversal filter as shown in FIG. 3 with a further, obliquely running transducer.

FIG. 4 shows a transversal filter in which it is possible to compensate for diffraction effects when the wave is reflected on the reflector 61.

At least one further transducer, which sees the first transducer 1 only after reflection on the chip edge, is particularly advantageous for this purpose. This may be achieved, for example, by a third transducer 3 which is arranged outside the acoustic track of the transducers 1, 2 and emits at a defined angle with respect to the substrate edge.

In this case, the filter also has a third transducer 3, in addition to a transducer arrangement as shown in FIG. 3. The acoustic track on the third transducer 3 runs obliquely with respect to the substrate edge and with respect to the acoustic track in which the first and the second transducers 1, 2 are arranged. A suitable alignment of the third transducer 3, in particular, by shifting it in the direction of the first transducer 1, makes it possible to compensate in the transversal filter for the regeneration effects which act as lagging signals. A signal which is referred to as a lagging signal does not correspond to an overlap weighting function that is physically present on the substrate, but to a virtually present overlap weighting function. The lagging signal is therefore located outside the time window within which the losses can be compensated for by suitable configuration of the overlap weighting function. These undesirable effects can nevertheless be compensated for by shifting the position of the third transducer 3 in the direction of the output transducer 1. In particular, this makes it possible to compensate for regeneration effects which are caused by the reflection of the electrical signal on the source impedance and result in a lagging signal.

By way of example, the third transducer 3 is a normal finger transducer or a split finger transducer.

The diffraction effects can also be compensated for by splitting the weighted transducer 2 into a plurality of preferably identical transducers which are connected electrically in parallel or in series. If the losses on the substrate edge are low, there is no need for the third transducer 3.

What is claimed is:

1. A transversal filter operating using surface acoustic waves, the transversal filter comprising:
    a piezoelectric substrate:
    an acoustic track arranged on the substrate;
    a first transducer arranged in the acoustic track; and
    a second transducer arranged in the acoustic track,
    wherein each transducer has electrode fingers,
    wherein the second transducer is weighted with a weighting function that characterizes a weighting of overlap length of electrode fingers of different polarity,
    wherein the weighting function has a cut-off main lobe and at least one side lobe,
    wherein an amplitude of the lobes decreases monotonally in a direction which points to the first transducer, and
    wherein the second transducer is adjacent to an acoustic reflector on a side facing away from the first transducer.

2. The transversal filter as claimed in claim 1,
    wherein each transducer has alternately arranged electrode fingers of different polarity,
    wherein a width of each electrode finger in the first transducer is approximately one quarter of a wavelength, and
    wherein each electrode finger in the second transducer is in a form of a split finger.

3. The transversal filter as claimed in claim 1, wherein the acoustic reflector and the second transducer are aligned such that an acoustic wave that passes through the second transducer in a direction of the acoustic reflector at a pass frequency of the transversal filter is substantially totally internally reflected on the acoustic reflector.

4. The transversal filter as claimed in claim 1, wherein the second transducer and the acoustic reflector are aligned with respect to one another such that a symmetrical impulse response is achieved in the acoustic filter.

5. The transversal filter as claimed in claim 1, wherein the second transducer and the acoustic reflector are aligned with respect to one another such that an anti-symmetrical impulse response is achieved in the acoustic filter.

6. The transversal filter as claimed in claim 1,
    wherein a distance between the acoustic reflector and a finger facing it at an end of the second transducer is $d/2+n\lambda/2$,
    where d is a distance between mutually facing edges of two sub-fingers of a respective split finger of the second transducer, n is an integer and $\lambda$ is a wavelength of a frequency in a pass band of the transversal filter.

7. The transversal filter as claimed in claim 1,
    wherein a minimum distance between the acoustic reflector and a finger facing the acoustic reflector at an end of the second transducer is $d/2+(2n-1)\lambda/4$,
    where d is a minimum distance between two sub-fingers of a respective split finger of the second transducer, n is an integer and $\lambda$ is a wavelength of a frequency in a pass band of the transversal filter.

8. The transversal filter as claimed in claim 1, wherein the acoustic reflector is formed by an edge of the piezoelectric substrate, which edge extends substantially parallel to the electrode fingers of the second transducer.

9. The transversal filter as claimed in claim 1, wherein the acoustic reflector is formed by a groove that is formed in the piezoelectric substrate and extends substantially parallel to the electrode fingers of the second transducer.

10. The transversal filter as claimed in claim 1, wherein the weighting function of the electrode fingers in the second transducer essentially follows a positive element of the function $\sin(x)/x$.

11. The transversal filter as claimed in claim 1, wherein the first transducer is arranged between the second transducer and an acoustically damping area.

12. The transversal filter as claimed in claim 1,
    wherein the second transducer is split in a transverse direction into at least two sub-transducers,
    wherein at least one of the sub-transducers is offset with respect to at least one other sub-transducer in a longitudinal direction.

13. The transversal filter as claimed in claim 12, wherein the offset in the longitudinal direction between the sub-transducers is about one quarter of a wavelength.

14. The transversal filter as claimed in claim 12,
    wherein the second transducer in the transverse direction is split into a first sub-transducer and two second sub-transducers,
    wherein the first sub-transducer is arranged between the second sub-transducers,
    wherein the first sub-transducer is aligned with respect to an acoustic reflector such that total internal reflection without any sudden phase change essentially takes place on the acoustic reflector,
    wherein the respective second sub-transducer is aligned with respect to the acoustic reflector such that the total internal reflection with a sudden phase change of essentially 180° takes place on the acoustic reflector.

15. A transversal filter operating using surface acoustic waves, the transversal filter comprising:
    a piezoelectric substrate:
    an acoustic track arranged on the substrate;
    a first transducer arranged in the acoustic track; and
    a second transducer arranged in the acoustic track,
    wherein each transducer has electrode fingers,
    wherein the second transducer is weighted with a weighting function that characterizes a weighting of overlap length of electrode fingers of different polarity,
    wherein the weighting function has a cut-off main lobe and at least one side lobe,
    wherein an amplitude of the lobes decreases monotonally in a direction which points to the first transducer, and
    wherein the first transducer is arranged between the second transducer and an acoustically damping area.

16. A transversal filter operating using surface acoustic waves, the transversal filter comprising:
    a piezoelectric substrate:
    an acoustic track arranged on the substrate;
    a first transducer arranged in the acoustic track; and
    a second transducer arranged in the acoustic track,
    wherein each transducer has electrode fingers,
    wherein the second transducer is weighted with a weighting function that characterizes a weighting of overlap length of electrode fingers of different polarity,
    wherein the weighting function has a cut-off main lobe and at least one side lobe,
    wherein an amplitude of the lobes decreases monotonally in a direction which points to the first transducer,
    wherein the second transducer is split in a transverse direction into at least two sub-transducers, and
    wherein at least one of the sub-transducers is offset with respect to at least one other sub-transducer in a longitudinal direction.

17. The transversal filter as claimed in claim 16, further comprising a third transducer that is aligned obliquely with respect to a first acoustic track,
  wherein the second transducer is adjacent to an acoustic reflector on a side facing away from the first transducer,
  wherein the third transducer is adjacent to the acoustic reflector, and
  wherein a wave that is excited in the third transducer is deflected on the acoustic reflector so that it arrives in the first transducer.

18. The transversal filter as claimed in claim 17,
  wherein the third transducer is aligned such that the wave that is transmitted by the third transducer and is deflected on the acoustic reflector at least partially cancels out a signal that is produced in the second transducer and falls outside a predetermined time window.

19. The transversal filter as claimed in claim 16, wherein the offset in the longitudinal direction between the sub-transducers is about one quarter of a wavelength.

20. The transversal filter as claimed in claim 16,
  wherein the second transducer in the transverse direction is split into a first sub-transducer and two second sub-transducers,
  wherein the first sub-transducer is arranged between the second sub-transducers,
  wherein the first sub-transducer is aligned with respect to an acoustic reflector such that total internal reflection without any sudden phase change essentially takes place on the acoustic reflector,
  wherein the respective second sub-transducer is aligned with respect to the acoustic reflector such that the total internal reflection with a sudden phase change of essentially 180° takes place on the acoustic reflector.

* * * * *